(12) United States Patent
Yi

(10) Patent No.: US 9,294,693 B1
(45) Date of Patent: Mar. 22, 2016

(54) IMAGE SENSOR WITH PIXEL UNITS HAVING INTERLEAVED PHOTODIODES

(71) Applicant: OMNIVISION TECHNOLOGIES, INC., Santa Clara, CA (US)

(72) Inventor: Xianmin Yi, Menlo Park, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/523,377

(22) Filed: Oct. 24, 2014

(51) Int. Cl.
*H04N 5/335* (2011.01)
*H01L 27/146* (2006.01)
*H04N 5/341* (2011.01)
*H04N 5/378* (2011.01)

(52) U.S. Cl.
CPC ............ *H04N 5/335* (2013.01); *H01L 27/1461* (2013.01); *H01L 27/14612* (2013.01); *H01L 27/14636* (2013.01); *H01L 27/14641* (2013.01); *H01L 27/14643* (2013.01); *H04N 5/341* (2013.01); *H04N 5/378* (2013.01)

(58) Field of Classification Search
CPC .......................... H04N 5/3745; H04N 5/37457
See application file for complete search history.

(56) References Cited

U.S. PATENT DOCUMENTS

| 7,417,273 | B2* | 8/2008 | Inoue ................ H01L 27/14603 257/291 |
| 2008/0049131 | A1* | 2/2008 | Theuwissen ........... H04N 5/343 348/302 |
| 2013/0313411 | A1* | 11/2013 | Ui ....................... H04N 5/35545 250/208.1 |
| 2014/0015025 | A1 | 1/2014 | Ahn et al. |
| 2014/0211053 | A1* | 7/2014 | Kido ................. H01L 27/14603 348/300 |
| 2015/0288896 | A1* | 10/2015 | Wang ....................... G06K 7/10 348/296 |

* cited by examiner

*Primary Examiner* — James Hannett
(74) *Attorney, Agent, or Firm* — Blakely Sokoloff Taylor & Zafman LLP

(57) ABSTRACT

An image sensor includes a plurality of photodiodes arranged into an array of rows and columns. The photodiodes are grouped into pixel units, where each pixel unit includes at least four photodiodes and shared pixel unit circuitry coupled to each of the four photodiodes. In one aspect the shared pixel unit circuitry may include a shared source follower transistor. In another aspect the shared pixel unit circuitry includes a shared reset transistor. Two of the photodiodes of the pixel unit are in a first column of the array and another two of the photodiodes are in a second column of the array. One of the photodiodes in the second column is in a row that is between rows of the two photodiodes in the first column.

23 Claims, 10 Drawing Sheets

IMAGE SENSOR WITH PIXEL UNITS HAVING INTERLEAVED PHOTODIODES

TECHNICAL FIELD

This disclosure relates generally to image sensors, and in particular but not exclusively, relates to the layout of complementary metal oxide semiconductor (CMOS) image sensors.

BACKGROUND INFORMATION

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors.

Conventional CMOS image sensors typically have a configuration in which a plurality of pixels are arranged into a two-dimensional array, where each pixel includes a photodiode and associated pixel transistors. Recently, with the continued miniaturization of image sensors, in order to reduce the area occupied by each pixel, a pixel sharing structure has been implemented where pixel transistors are shared among several photodiodes. However, typical layouts of a pixel sharing structure often suffer from leakage problems between various portions of the pixel transistors due to their close proximity to one another.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 2A is a diagram of an array with a single highlighted two-photodiode pixel unit of an image sensor, in accordance with an embodiment of the present disclosure.

FIG. 2B is a diagram highlighting two two-photodiode pixel units of the image sensor array of FIG. 2A.

FIG. 2C is a diagram highlighting three two-photodiode pixel units of the image sensor array of FIG. 2A.

FIG. 2D is a diagram highlighting five two-photodiode pixel units of the image sensor array of FIG. 2A.

DETAILED DESCRIPTION

Embodiments of an Image Sensor with Pixel Units having a Mirrored Transistor Layout are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
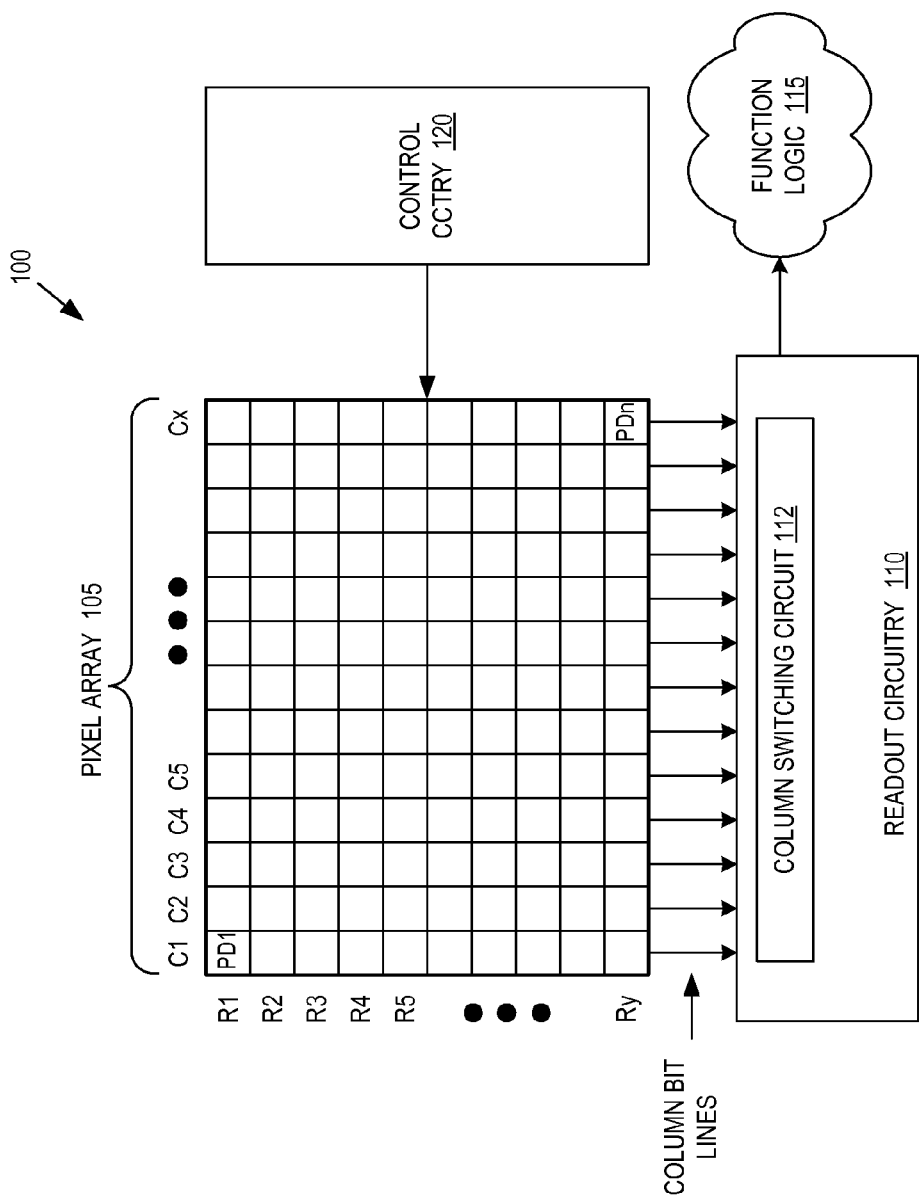
FIG. 1 is a block diagram illustrating an image sensor, in accordance with an embodiment of the present disclosure.

FIG. 1 is a block diagram illustrating an image sensor 100, in accordance with an embodiment of the present disclosure. The illustrated embodiment of image sensor 100 includes an active area (i.e., pixel array 105), readout circuitry 110, function logic 115, and control circuitry 120.

For example, pixel array 105 may be a two-dimensional array of backside or frontside illuminated imaging pixels (e.g., pixels PD1, . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render an image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. As will be discussed below, the pixels of array 105 may be grouped into several pixel units that share common shared pixel unit circuitry. The pixels may be grouped into pixel units such that each pixel unit includes pixels from different rows and from different columns. In one embodiment, each pixel unit is coupled to no more than one column bit line. Accordingly, readout circuitry 110 may include an optional column switching circuit 112 to shift image signals from one column to an adjacent column when necessary during readout.

Function logic 115 may simply store the image data or even manipulate the image data by applying post image effects (e.g., crop, rotate, remove red eye, adjust brightness, adjust contrast, or otherwise). In one embodiment, readout circuitry 110 may readout a row of image data at a time along column bit lines or may readout the image data using a variety of other techniques, such as a serial readout or a full parallel readout of all pixels simultaneously.

Control circuitry 120 is coupled to pixel array 105 to control operational characteristics of pixel array 105. For example, control circuitry 120 may generate a global shutter signal for controlling image acquisition.

Figures 2A, 2B:
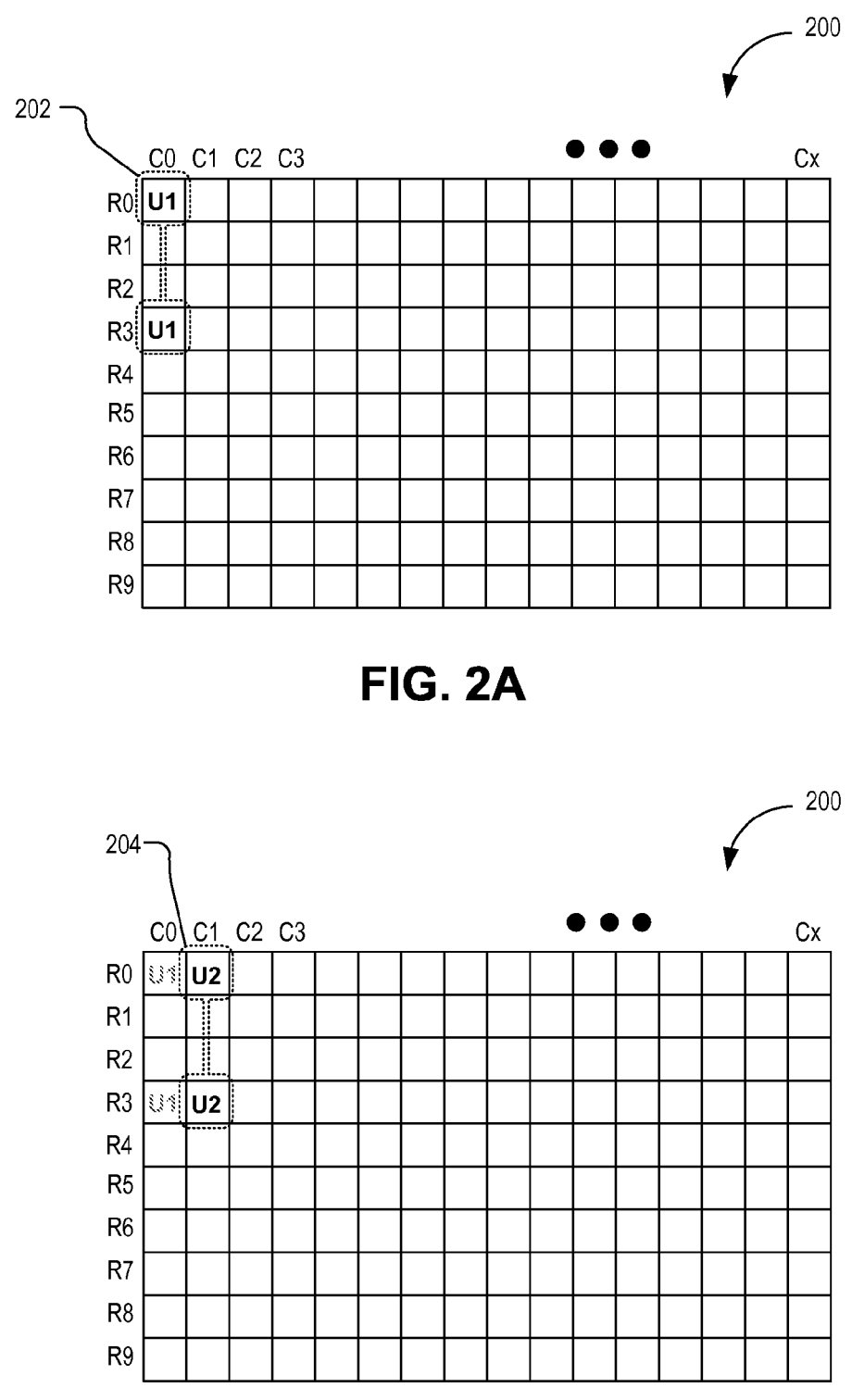

FIG. 2A is a diagram of an array 200 with a first highlighted two-photodiode pixel unit (U1) 202 of an image sensor, in accordance with an embodiment of the present disclosure. In one aspect, a "pixel unit" is a grouping of one or more imaging pixels, such as the imaging pixels of pixel array 105 in image sensor 100 in FIG. 1. A pixel unit may include several photodiodes each corresponding with a separate pixel of the pixel unit, and may also include at least one pixel transistor that is shared among the photodiodes of the pixel unit.

As illustrated, pixels of array 200 are arranged into a column (e.g., column C0 to Cx) and a row (e.g., rows R0 to R9). For purposes of discussion herein, each pixel may be referred to by a unique coordinate reference that includes both a column number and a row number (e.g., [Cx, Ry]). Thus, the pixel unit 202 includes two pixels (pixel [0,0] and pixel [0,3]). In one embodiment, pixel unit 202 includes exactly two pixels and thus, includes two photodiodes. As will be discussed below, pixel unit 202 may include shared pixel circuitry that is coupled to both pixels of pixel unit 202. The shared pixel circuitry may include a shared amplification circuitry (e.g., shared source-follower transistor), and/or may include a shared reset circuitry (e.g., shared reset transistor). In one embodiment, pixel unit 202 also includes a shared charge-to-voltage conversion region (e.g., a floating diffusion region).

As shown in FIG. 2A, photodiodes of pixel unit 202 are both in the same column C0, but yet in differing rows (e.g., R0 and R3). Thus, in the example array 200, pixel unit 202 includes two photodiodes in the same column with two separate rows (e.g., R1 and R2) interposed there between. These interposed rows R1 and R2 may include pixels of a separate pixel unit.

The layout of several additional pixel units of the same array 200 are described in the following FIGS. 2B-2D. For example, FIG. 2B is a diagram highlighting two two-photodiode pixel units (e.g., pixel unit U1 and pixel unit (U2) 204) of image sensor array 200. As shown, the second pixel unit 204 is disposed immediately adjacent to pixel unit U1. Pixel unit 204 includes two pixels and thus includes two photodiodes (e.g., pixel [1,0] and pixel [1,3]). Pixel unit 204 also includes shared pixel circuitry (not shown in FIG. 2B) coupled to both pixels of pixel unit 204. The shared pixel circuitry of pixel unit 204 is separate and distinct from the shared pixel circuitry of pixel unit U1 202.

Figures 2C, 2D:
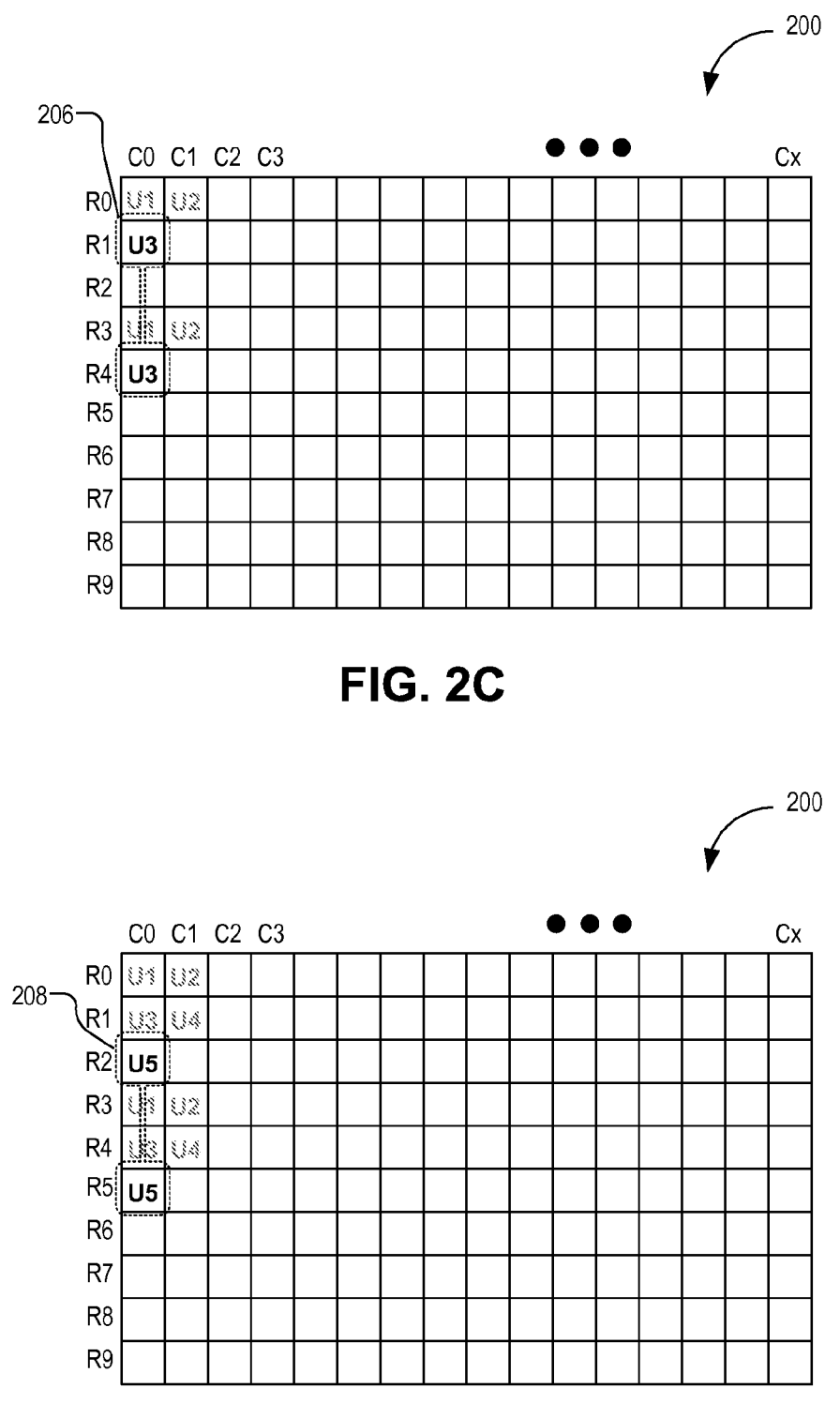

FIG. 2C is a diagram highlighting a third two-photodiode pixel unit (U3) 206 of the image sensor array 200. As shown, the third pixel unit 206 includes two pixels (i.e., pixel [0,1] and pixel [0,4]) that are interleaved with the pixels of pixel unit U1. That is, both pixels of pixel unit 206 are in the same column C0 as both pixels of pixel unit U1 and at least one of the pixels of pixel unit 206 is in a row that is interposed between the rows of pixel unit U1. By way of example, pixel [0,1] is in row R1, which is interposed between row R0 of pixel [0,0] and row R3 of pixel [0,3]. Pixel unit 206 also includes shared pixel circuitry (not shown in FIG. 2C) coupled to both pixels of pixel unit 206. The shared pixel circuitry of pixel unit 206 is separate and distinct from any other shared pixel circuitry of array 200.

FIG. 2D is a diagram highlighting five two-photodiode pixel units (e.g., U1-U5) of the image sensor array 200. As shown, the fifth pixel unit (U5) 208 includes two pixels (e.g., pixel [0,2] and pixel [0,5]) that are interleaved with the pixels of pixel unit U1. The two pixels of pixel unit 208 are also interleaved with the pixels of pixel unit U3. That is, all pixels of pixel units U1, U3, and U5 are in the same column C0 and at least one of the pixels of pixel unit 208 is in a row that is interposed between the rows of pixel unit U1 and between the rows of pixel unit U3. As with the previously discussed pixel units, pixel unit 208 includes shared pixel circuitry (not shown in FIG. 2C) coupled to both pixels of pixel unit 208 that is separate and distinct from any other shared pixel circuitry of array 200.

Figure 3A:
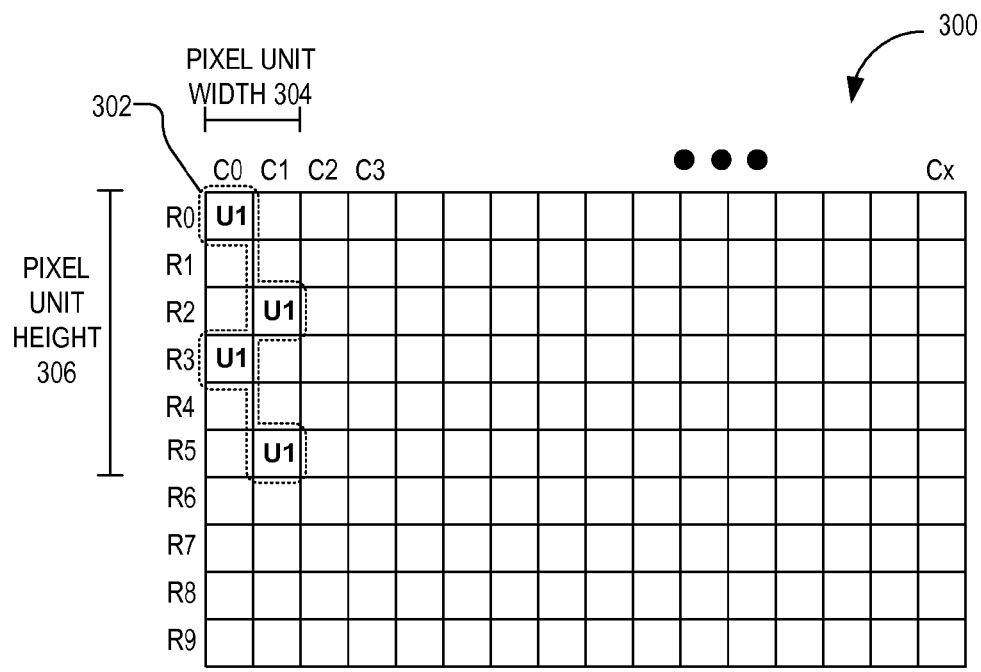
FIG. 3A is a diagram of an array with a single highlighted four-photodiode pixel unit of an image sensor, in accordance with an embodiment of the present disclosure.

FIG. 3A is a diagram of an array 300 with a highlighted four-photodiode pixel unit 302 of an image sensor, in accordance with an embodiment of the present disclosure. The layout of several pixel units of the same array 300 are described in the FIGS. 3A-3F. The layout described in FIGS. 3A-3F is one possible grouping of photodiodes into pixel units, as may be applied to pixel array 105 of FIG. 1.

As shown in FIG. 3A, pixel unit 302 includes four pixels (pixels [0,0], [0,3], [1,2], and [1,5]). The arrangement of the pixels included in pixel unit (U1) 302 may represent a pixel unit pattern that may be applied to each of the pixel units included in array 300. In one embodiment, pixel unit 302 include exactly four pixels and thus, includes four photodiodes. Pixel unit 302 may include shared pixel circuitry (e.g., shared source-follower transistor and/or shared reset transistor) that is coupled to all four pixels of pixel unit 302. In one embodiment, pixel unit 302 also includes one or more shared charge-to-voltage conversion region (e.g., a floating diffusion region). By way of example, pixel unit 302 may include a first shared floating diffusion region coupled to receive charge accumulated in the photodiodes of pixels [0,0] and [0,3], and a second shared floating diffusion region coupled to receive charge accumulated in the photodiodes of pixels [1,2] and [1,5]. In one embodiment, both the first and second shared floating diffusion regions are electrically connected to one another.

As shown in FIG. 3A, pixel unit 302 includes no more than four pixels (e.g., photodiodes) and has a pixel height 306 that spans six rows (i.e., row R0 through row R5) and a pixel width 304 that spans two columns (i.e., column C0 through column C1) of array 300. As shown in the example of FIG. 3A, two of the photodiodes of pixel unit 302 are in the same column C0 and the other two photodiodes are in an adjacent column C1. Each of the illustrated pixels of pixel unit 302 are in a different row from one another. That is, pixel unit 302 includes one pixel in row R0, one in row R2, one in row R3, and one in row R5. As is further shown, pixel [1,2] is in a row that is between the rows of pixel [0,0] and pixel [0,3]. Furthermore, pixel unit 302 may have a pattern that includes two rows (i.e., row R1 and row R2) that are interposed between the rows of pixels [0,0] and [0,3] within the same column C0. As will be illustrated in further detail below, these interposed rows R1 and R2 may include pixels of a separate pixel unit.

Figure 3B:
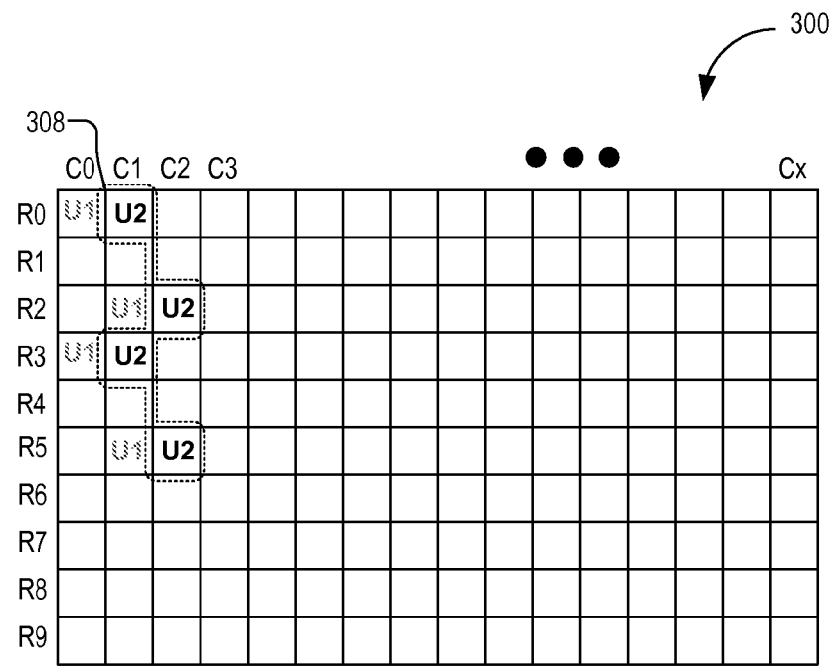
FIG. 3B is a diagram highlighting two four-photodiode pixel units of the image sensor array of FIG. 3A.

FIG. 3B is a diagram highlighting a second four-photodiode pixel unit (U2) 308 of the image sensor array 300. The four-photodiode pixel unit 308 is disposed immediately adjacent to pixel unit U1. Pixel unit 308 is of the same pattern as pixel unit U1 and thus also includes four pixels (e.g., pixels [1,0], [1,3], [2,2], and [2,5]). Pixel unit 308 also includes shared pixel circuitry (not shown in FIG. 3B) coupled to all four pixels of pixel unit 308. The shared pixel circuitry of pixel unit 308 is separate and distinct from the shared pixel circuitry of pixel unit U1 302.

As shown in FIG. 3B, the second pixel unit 308 includes pixels that are interleaved with the pixels of pixel unit U1. That is, two of the pixels of pixel unit 308 are in the same column C1 as two of the pixels of pixel unit U1 and at least one of the pixels of pixel unit 308 is in a row that is interposed between the rows of pixel unit U1. By way of example, pixel [1,3] is in row R3, which is interposed between row R2 of pixel [1,2] and row R5 of pixel [1,5]. Also, each of the pixels of pixel unit 308 are in the same rows, respectively, as the pixels of pixel unit U1 302. That is, both pixel units include a respective pixel in rows R0, R2, R3, and R5.

Similar to pixel unit U1, pixel unit 308 may also include one or more shared charge-to-voltage conversion region (e.g., a floating diffusion region). By way of example, pixel unit 308 may include a first shared floating diffusion region coupled to receive charge accumulated in the photodiodes of pixels [1,0] and [1,3], and a second shared floating diffusion region coupled to receive charge accumulated in the photodiodes of pixels [2,2] and [2,5]. The floating diffusion regions of pixel unit 308 are separate and distinct from the floating diffusion regions of pixel unit U1.

Figure 3C:
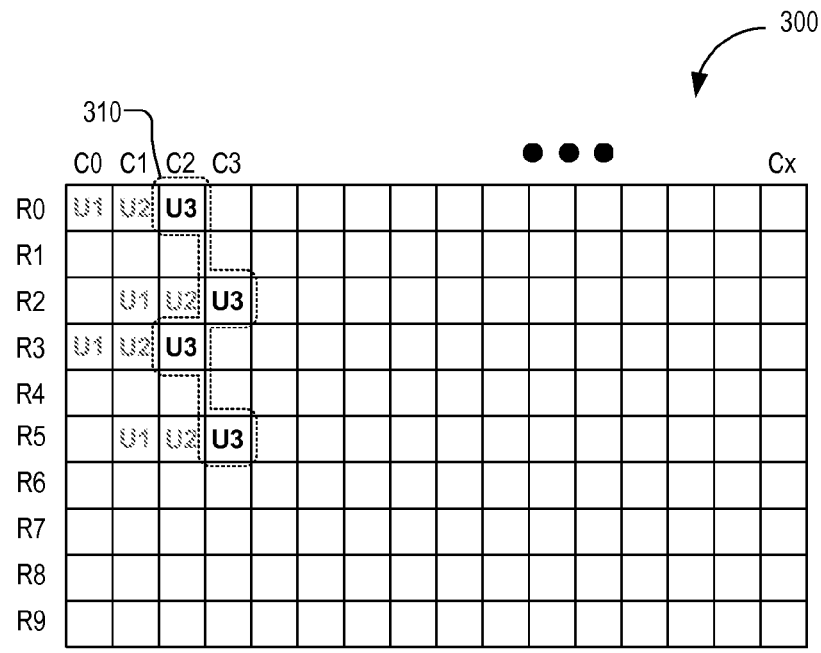
FIG. 3C is a diagram highlighting three four-photodiode pixel units of the image sensor array of FIG. 3A.

FIG. 3C is a diagram highlighting a third four-photodiode pixel unit 310 of the image sensor array 300. The four-photodiode pixel unit 310 is disposed immediately adjacent to pixel unit U2. Pixel unit 310 is of the same pattern as pixel units U1 and U2, and thus also includes four pixels (e.g., pixels [2,0], [2,3], [3,2], and [3,5]). Pixel unit 310 also includes shared pixel circuitry (not shown in FIG. 3C) coupled to all four pixels of pixel unit 310. The shared pixel circuitry of pixel unit 310 is separate and distinct from any other shared pixel circuitry of array 300.

As shown in FIG. 3C, the third pixel unit 310 includes pixels that are interleaved with the pixels of pixel unit U2. That is, two of the pixels of pixel unit 310 are in the same column C2 as two of the pixels of pixel unit U2 and at least one of the pixels of pixel unit 310 is in a row that is interposed between the rows of pixel unit U2. By way of example, pixel [2,3] is in row R3, which is interposed between row R2 of pixel [2,2] and row R5 of pixel [2,5]. Also, each of the pixels of pixel unit 310 are in the same rows, respectively, as the pixels of pixel unit U2. That is, both pixel units include a respective pixel in rows R0, R2, R3, and R5.

Figure 3D:
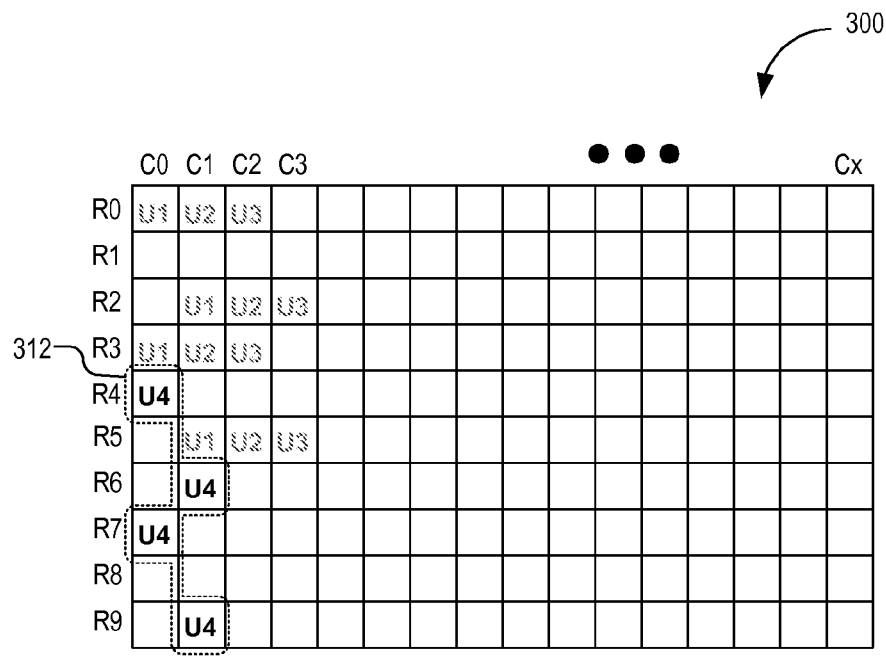
FIG. 3D is a diagram highlighting four four-photodiode pixel units of the image sensor array of FIG. 3A.

FIG. 3D is a diagram highlighting a fourth four-photodiode pixel unit (U4) 312 of the image sensor array 300. As shown in FIG. 3D, pixel unit 312 is of the same pattern as pixel units U1 through U3, and thus also includes four pixels (e.g., pixels [0,4], [0,7], [1,6], and [1,9]). However, pixel unit 312 is shifted down four rows with respect to pixel unit U1 so as to group pixels of rows R4, R6, R7, and R9.

Figure 3E:
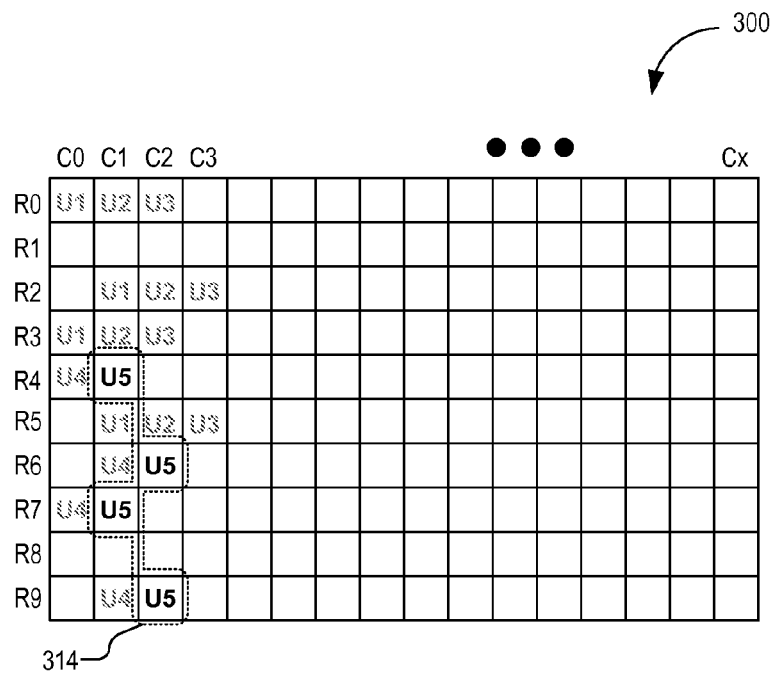
FIG. 3E is a diagram highlighting five four-photodiode pixel units of the image sensor array of FIG. 3A.

FIG. 3E is a diagram highlighting a fifth four-photodiode pixel unit 314 of the image sensor array 300. The four-photodiode pixel unit 314 is disposed immediately adjacent to pixel unit U4. Pixel unit 314 is of the same pattern as pixel units U1-U4 and thus also includes four pixels (e.g., pixels [1,4], [1,7], [2,6], and [2,7]).

As shown in FIG. 3E, the fifth pixel unit 314 includes pixels that are interleaved with the pixels of pixel unit U4. That is, two of the pixels of pixel unit 314 are in the same column C1 as two of the pixels of pixel unit U4 and at least one of the pixels of pixel unit 314 is in a row that is interposed between the rows of pixel unit U4. By way of example, pixel [1,7] is in row R7, which is interposed between row R6 of pixel [1,6] and row R9 of pixel [1,9]. Also, each of the pixels of pixel unit 314 are in the same rows, respectively, as the pixels of pixel unit U4. That is, both pixel units include a respective pixel in rows R4, R6, R7, and R9.

Figure 3F:
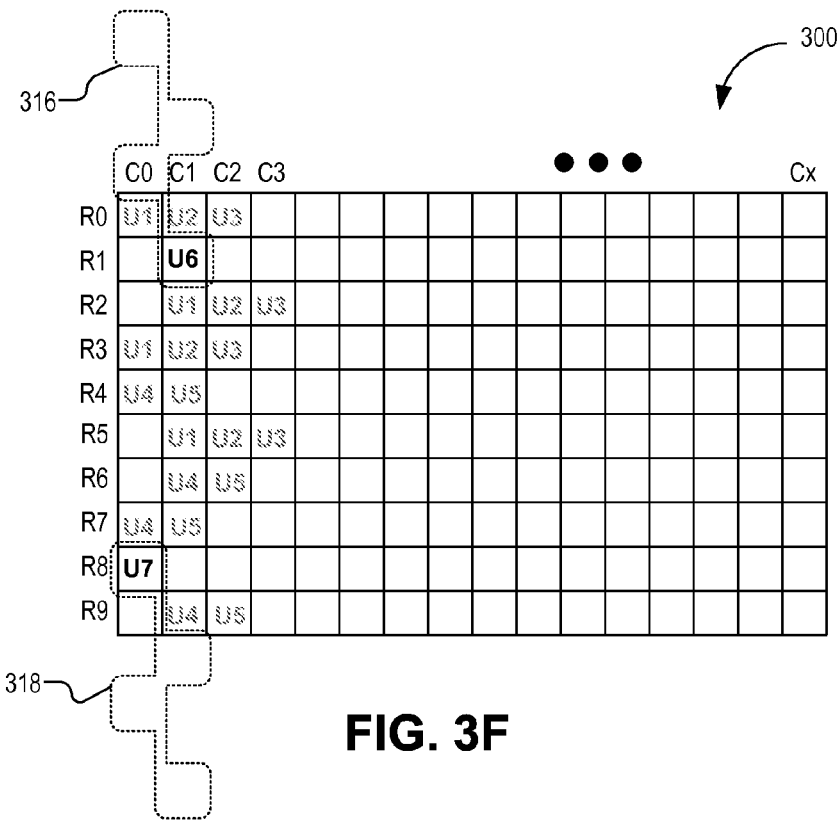
FIG. 3F is a diagram highlighting a seventh and eighth pixel unit of the image sensor array of FIG. 3A.

Although FIGS. 3A-3F illustrate array 300 as including nine rows, in practice an array may include hundreds, if not thousands of rows and/or columns. Thus, the pattern of pixel units U1-U5 may also be applied for the grouping of the remainder pixels of the pixel array 300. The layout of FIGS. 3A-3E illustrate the grouping of pixels along rows R0, R2-R7, and R9. With regards to the grouping of pixels in rows or columns at or near an edge of the array, the same pattern may be projected over the array so that each pixel of the array is grouped into a respective pixel unit. For example, FIG. 3F is a diagram highlighting a sixth pixel unit (U6) 316 and an eighth pixel unit (U7) of the image sensor array 300. In one embodiment, the pixels in rows or columns at or near the edge of the array may be dummy rows that are not used in the image acquisition process. For example, in the embodiment of FIG. 3F, rows R1 and R8 may be dummy rows of array 400.

Figure 4A:
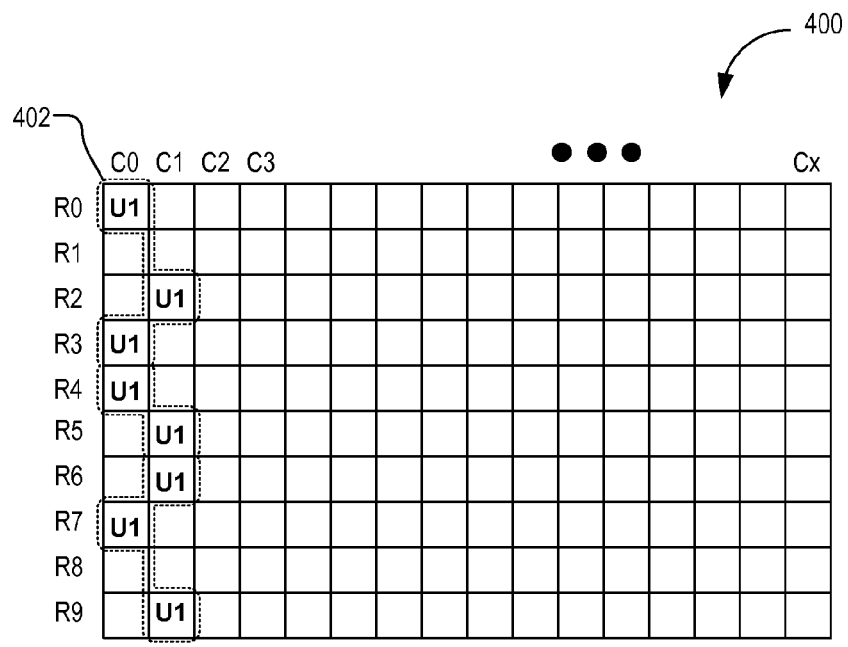
FIG. 4A is a diagram of an array with a single highlighted eight-photodiode pixel unit of an image sensor, in accordance with an embodiment of the present disclosure.

FIG. 4A is a diagram of an array 400 with a highlighted eight-photodiode pixel unit 402 of an image sensor, in accordance with an embodiment of the present disclosure. The layout described in FIGS. 4A and 4B is one possible grouping of photodiodes into pixel units, as may be applied to pixel array 105 of FIG. 1.

As shown in FIG. 4A, pixel unit 402 includes eight pixels (pixels [0,0], [0,3], [0,4], [0,7], [1,2], [1,5], [1,6], and [1,9]). The arrangement of the pixels included in pixel unit (U1) 402 may represent a pixel unit pattern that may be applied to each of the pixel units included in array 400. In one embodiment, pixel unit 402 include exactly eight pixels and thus, includes eight photodiodes. Pixel unit 402 may include shared pixel circuitry (e.g., shared source-follower transistor and/or shared reset transistor) that is coupled to all eight pixels of pixel unit 402. In one embodiment, pixel unit 402 also includes one or more shared charge-to-voltage conversion region (e.g., a floating diffusion region). In one embodiment, each of the shared floating diffusion regions included in pixel unit 402 are electrically connected to one another.

As shown in FIG. 4A, pixel unit 402 includes no more than eight pixels (e.g., photodiodes) and has a pixel height that spans ten rows (i.e., row R0 through row R9) and a pixel width that spans two columns (i.e., column C0 through column C1) of array 400. As shown in the example of FIG. 4A, four of the photodiodes of pixel unit 402 are in the same column C0 and the other four photodiodes are in adjacent column C1. Each of the illustrated pixels of pixel unit 402 are in a different row from one another. That is, pixel unit 402 includes one pixel in row R0, one in row R2, one in row R3, one in row R4, one in row R5, one in row R6, one in row R7, and one in row R9. As is further shown, pixel [1,2] is in a row that is between the rows of pixel [0,0] and pixel [0,3]. Furthermore, pixel unit 402 may have a pattern that includes two rows (i.e., row R1 and row R2) that are interposed between the rows of pixels [0,0] and [0,3] within the same column C0. Similarly, rows R3 and R4 are interposed between pixels [1,2] and [1,5]. As will be illustrated in further detail below, these interposed rows may include pixels of a separate pixel unit.

Figure 4B:
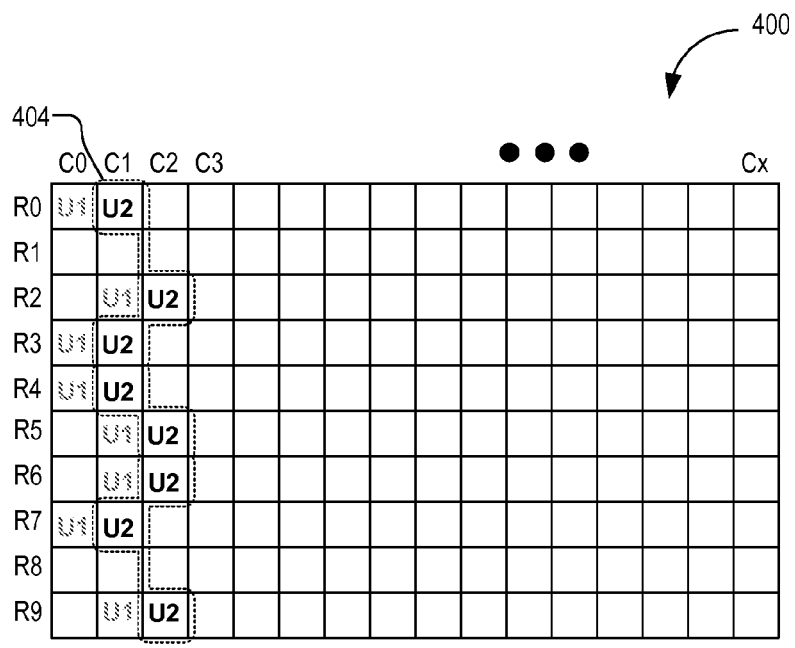
FIG. 4B is a diagram highlighting two eight-photodiode pixel units of the image sensor array of FIG. 4A.

FIG. 4B is a diagram highlighting a second eight-photodiode pixel unit (U2) 404 of the image sensor array 400. The eight-photodiode pixel unit 404 is disposed immediately adjacent to pixel unit U1. Pixel unit 404 is of the same pattern as pixel unit U1 and thus also includes eight pixels (e.g., pixels [1,0], [1,3], [1,4], [1,7], [2,2], [2,5], [2,6] and [2,9]). Pixel unit 404 also includes shared pixel circuitry (not shown in FIG. 4B) coupled to all eight pixels of pixel unit 404. The shared pixel circuitry of pixel unit 404 is separate and distinct from the shared pixel circuitry of pixel unit U1.

As shown in FIG. 4B, the second pixel unit 404 includes pixels that are interleaved with the pixels of pixel unit U1. That is, four of the pixels of pixel unit 404 are in the same column C1 as four of the pixels of pixel unit U1 and at least one of the pixels of pixel unit 404 is in a row that is interposed between the rows of pixel unit U1. By way of example, pixels

[1,3] and [1,4] are in row R3 and R4, respectively, which are interposed between rows R2 of pixel [1,2] and row R5 of pixel [1,5]. Also, each of the pixels of pixel unit 404 are in the same rows, respectively, as the pixels of pixel unit U1 302. That is, both pixel units include a respective pixel in rows R0, R2, R3, R4, R5, R6, R7, and R9. Similar to pixel unit U1, pixel unit 404 may also include one or more shared charge-to-voltage conversion region (e.g., a floating diffusion region) that are separate and distinct from the floating diffusion regions of pixel unit U1.

Figure 5:
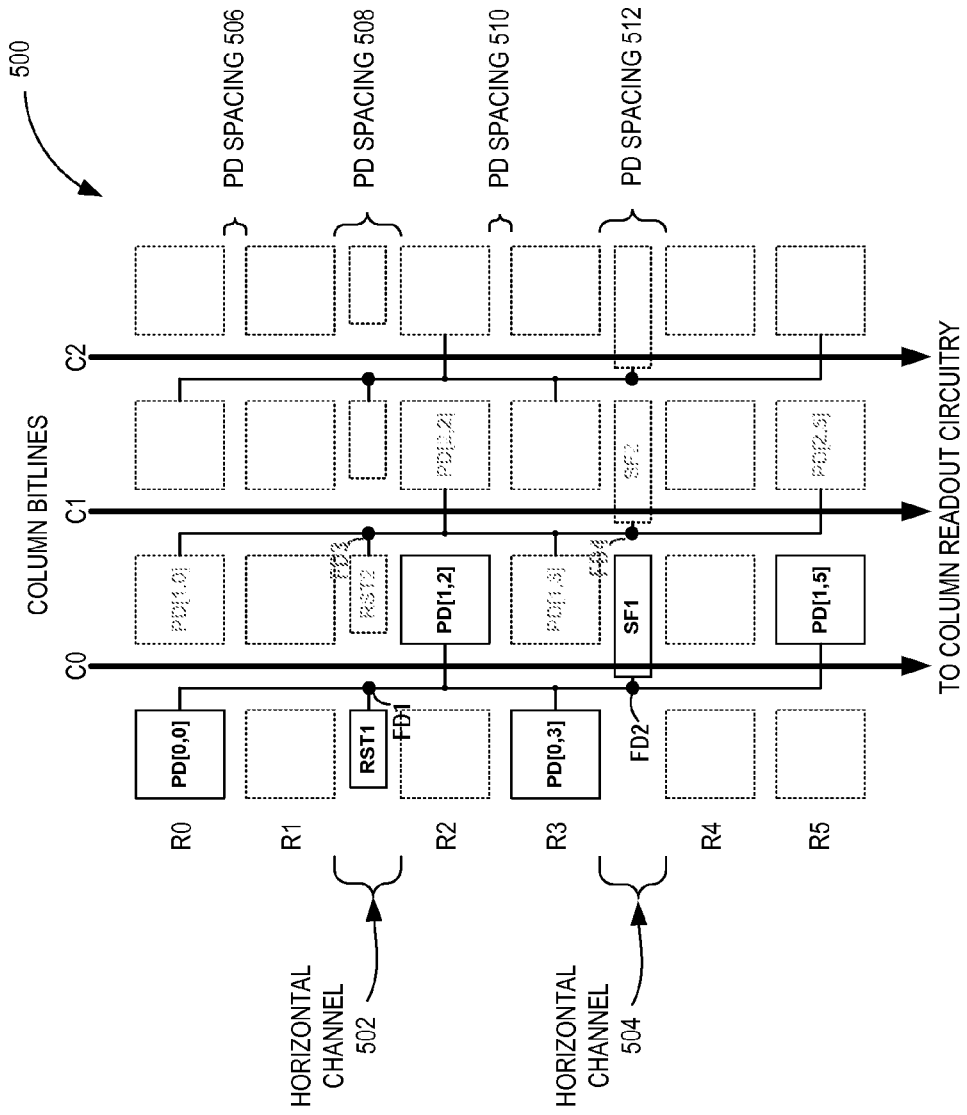
FIG. 5 is a diagram of an array with two highlighted four-photodiode pixel units in addition to shared pixel unit circuitry, in accordance with an embodiment of the present disclosure.

FIG. 5 is a diagram of an array 500 illustrating two four-photodiode pixel units each having shared pixel unit circuitry, in accordance with an embodiment of the present disclosure. A first pixel unit of array 500 is shown as including photodiode regions PD[0,0], PD[0,3], PD[1,2], and PD[1,5], as well as shared reset transistor RST1, shared source follower transistor SF1, and shared floating diffusion regions FD1 and FD2. A second adjacent pixel unit of array 500 is shown as including photodiode regions PD[1,0], PD[1,3], PD[2,2], and PD[2,5], as well as shared reset transistor RST2, shared source follower transistor SF2, and shared floating diffusion regions FD3 and FD4. As shown in FIG. 5, each pixel unit of array 500 is coupled to no more than one column bit line. That is, the first pixel unit is coupled to column bit line C0 by way of source follower transistor SF1, while the second pixel unit is coupled to column bit line C1 by way of source follower transistor SF2. The pixel units of array 500 are of the same pixel unit pattern as described above with reference to FIGS. 3A-3F.

As shown in FIG. 5, shared pixel unit circuitry may be disposed in the array along a single horizontal channel that is between rows of photodiodes. For example, shared reset transistor SF1 of the first pixel unit and the shared reset transistor SF2 of the second pixel unit, as well as the shared reset transistors of other pixel units, are disposed along single horizontal channel 502 that is interposed between rows R1 and row R2. Similarly, shared source follower transistors SF1, SF2, as well as other shared source follower transistors are disposed along single horizontal channel 504 that is interposed between rows R3 and R4. In one embodiment, pixel array 500 includes no shared pixel circuitry between rows R0 and R1, nor does it include shared pixel circuitry between rows R2 and R3. Thus, the grouping of shared reset transistors along horizontal channel 502 may allow for the photodiode spacing (i.e., distance between adjacent rows of photodiode regions) to be more compact. For example, the illustrated photodiode spacing 506 between rows R0 and R1, is less than the photodiode spacing 508 between rows R1 and R2. Similarly, the photodiode spacing 510 between rows R2 and R3 is less than the photodiode spacing 512 between rows R3 and R4.

As shown in FIG. 5, the shared floating diffusion regions may also be disposed in the horizontal channels between adjacent rows of array 500. For example, shared floating diffusion regions FD1 and FD3 are disposed in horizontal channel 502, while shared floating diffusion regions FD2 and FD4 are disposed in horizontal channel 504. Also, although not shown in FIG. 5, additional pixel circuitry, such as shutter gates, transfer gates, and storage gates may be included in one or more of the illustrated horizontal channels. Having shared pixel circuitry and/or routings may provide for more space and better isolation between components of the pixel units so as to reduce leakage. Furthermore, having a shared metal routings reduces interconnect couplings, simplifies fabrication, and reduces cost.

Figure 6:
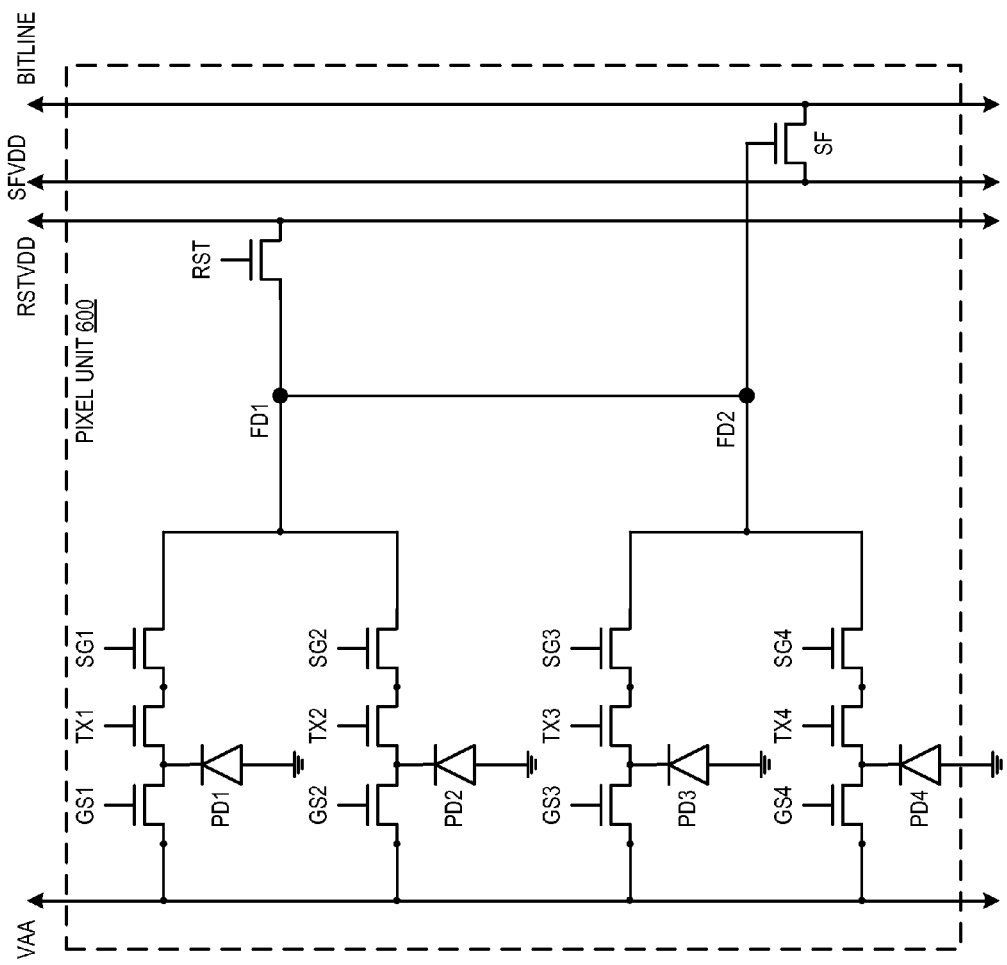
FIG. 6 is a circuit diagram illustrating pixel circuitry of a four-photodiode pixel unit within an image sensor, in accordance with an embodiment of the present disclosure.

FIG. 6 is a circuit diagram illustrating pixel circuitry of a four-photodiode pixel unit 600 within an image sensor, in accordance with an embodiment of the present disclosure. Pixel circuitry 600 is one possible pixel circuitry architecture for implementing each pixel unit within array 300 and/or 500. That is, the photodiodes PD1-PD4 of FIG. 6 may be included in an array pattern that has them arranged in two columns, where each photodiode is in a different row from one another. However, it should be appreciated that embodiments of the present invention are not limited to the illustrated pixel architectures; rather, one of ordinary skill in the art having the benefit of the instant disclosure will understand that the present teachings are also applicable to various other pixel architectures.

In FIG. 6, pixel unit 600 circuitry includes four photodiodes (PD1-PD4), four shutter gates (SG1-4), four transfer transistors (TX1-4), four storage gates (SG1-4), a shared reset transistor RST, a shared source-follower transistor SF, and shared floating diffusion regions FD1 and FD2. In one embodiment, the shutter gates are global shutter gates, such that each shutter gate in the array is connected to one another to allow a global reset of all photodiodes simultaneously. Global control of the shutter gates may allow for the reducing of motion effects that may be seen when compared to row-by-row resetting of the photodiodes. Similarly, the transfer gates may also be global gates, such that each transfer gate in the array is connected to one another to allow a global transfer of charge from the photodiodes to their respective storage gates simultaneously. Global control of the transfer gates may allow the transfer of image data out of the photodiodes simultaneously so as to reduce image blur when compared to row-by-row implementations.

During a readout operation, all transfer transistors TX1-TX4 may simultaneously receive a transfer signal, which causes transfer transistors to transfer the charge accumulated in their respective photodiodes to their respective storage gates (SG1-4). Row-by-row readout may then be accomplished by activating the storage gate signal SG1 to transfer the stored charge to floating diffusion regions FD1 and FD2. The floating diffusion regions are coupled to the gate of the shared source-follower transistor SF. The source-follower transistor SF is coupled between a source-follower voltage supply SFVDD and a column bit line. The source-follower transistor SF operates as a source-follower providing a high impedance output from floating diffusion regions FD 1 and FD2 to the column bit line.

Shared reset transistor RST is coupled between a reset voltage supply RSTVDD and the floating diffusion regions FD1 and FD2 to reset (e.g., discharge or charge the FDs to a preset voltage) under control of a reset signal. In one embodiment, shutter signals, the transfer signals, the storage gate signals, and the reset signal are generated by control circuitry 120.

Because some embodiments discussed herein include the interleaving of photodiodes of differing pixel units, the readout circuitry of the image sensor may be configured to compensate for the scrambled pixel addressing during a readout operation. In one embodiment, a readout of the array is implemented where the readout circuit (e.g., readout circuit 110) includes a buffer memory for temporarily storing the pixel output signals of several rows which are then rearranged into their correct rows.

Figure 7:
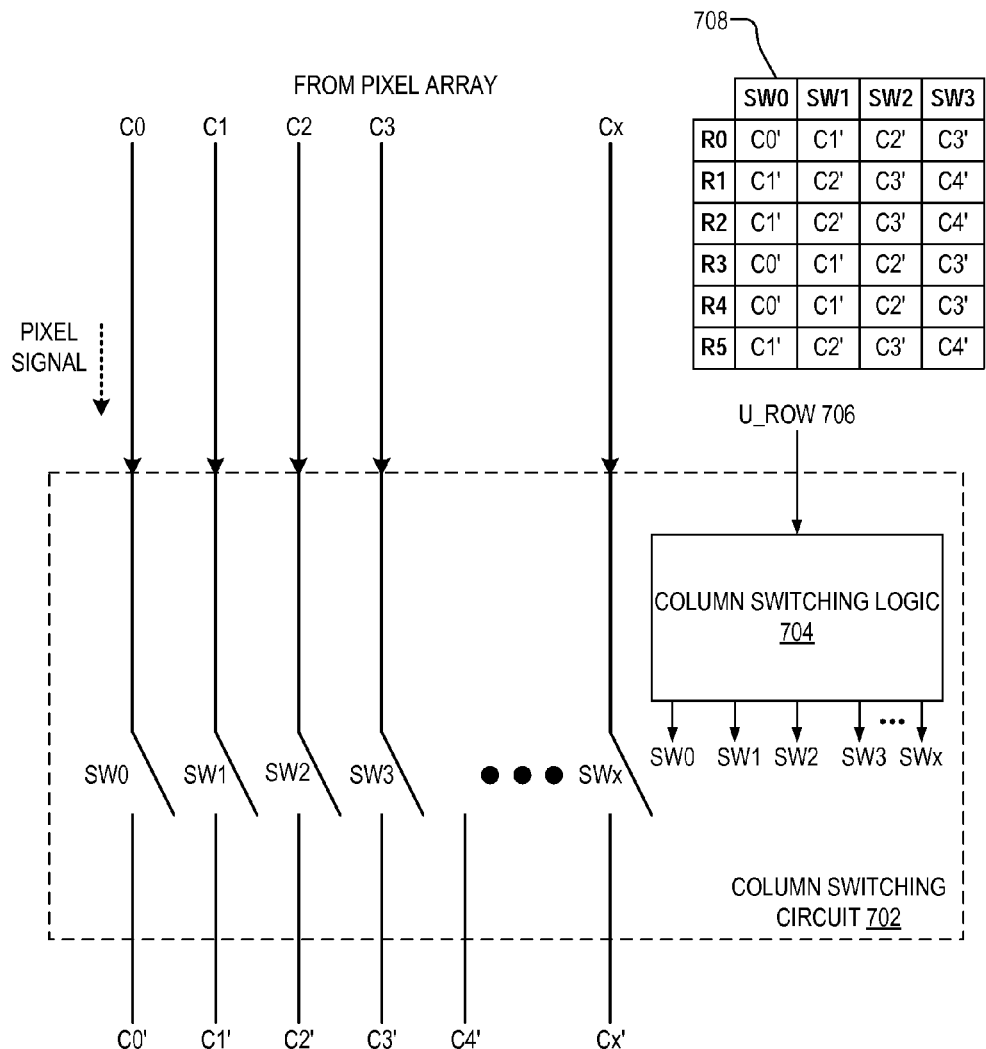
FIG. 7 is a functional block diagram illustrating a column switching circuit, in accordance with an embodiment of the present disclosure.

In another embodiment, column switching circuitry may be included in the readout circuitry to shift pixel output from one column to another column during readout. For example, FIG. 7 is a functional block diagram illustrating a column switching circuit 702, in accordance with an embodiment of the present disclosure. Column switching circuit 702 is one possible implementation of column switching circuit 112 of FIG. 1. As shown in FIG. 7, column switching circuit 702 includes a plurality of switches (i.e., SW0-SWx), where each switch is connected to a respective column (C0-Cx) of the array. Column switching circuit 702 also includes column switching logic 704 for controlling operation of the switches SW0-SWx in response to which row is currently being readout. In one embodiment, column switching logic 704 is coupled to receive a row signal U_ROW 706, which indicates which row of the array is currently being readout. In operation, activation of one of the column switching circuit switches causes that switch to connect one column bit line to an adjacent column bit line. For example, activation of switch SWO, causes switch SWO to disconnect bit line C0 from C0' and to instead connect bit line C0 to adjacent bit line C1'. Similarly, activation of switch SW1 causes switch SW1 to disconnect bit line C1 from C1' and to connect bit line C1 to bit line C2'.

FIG. 7 also illustrates an example logic table 708. Logic table 708 is one possible implementation of the logic included in column logic 704. Logic table 708 may correspond to the pixel unit pattern implemented in the array 500 of FIG. 5. The implementation of logic table 708 will now be described with reference to FIGS. 5 and 7. As shown in FIG. 5, photodiode [0,0] is physically located in column C0 and is also coupled to have its pixel signal readout on column bit line C0. Thus, during a readout operation of row R0, each of the switches SWO-SWx are controlled by column switching logic 704 to allow pixel signals to pass straight through (i.e., bit line C0 to C0', C1 to C1', and C2 to C2', etc.). However, photodiode[1,2] is physically located in column C1, but is also coupled to have its pixel signal readout on column bit line C0. Accordingly, during a readout operation of row R2, each of the switches SW1-SWx are activated to shift the pixels signals to the right by one column. That is, during readout of row R2, column switching logic 704 activates SWO to connect column bit line C0 to column bit line C1', SW1 to connect column bit line C1 to column bit line C2', and SW2 to connect column bit line C2 to column bit line C3'. Thus, similar logic is followed where pixel signals from pixels that are physically located in the same column as the column bit line they are connected to are allowed to pass straight through, while pixels signals from pixels that are connected to a column bit line that is different from the column of their physical location are shifted.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising a plurality of photodiodes arranged into an array of rows and columns, wherein the plurality of photodiodes are grouped into pixel units, each pixel unit including a first, a second, a third, and a fourth photodiode and shared pixel unit circuitry coupled to each of the first, second, third, and fourth photodiodes, wherein the shared pixel unit circuitry of each one of the pixel units comprises a single shared source follower transistor, wherein the first and second photodiodes are in a first column of the array and the third and fourth photodiodes are in a second column of the array, and wherein the third photodiode is in a row that is between a row of the first photodiode and a row of the second photodiode.

2. The image sensor of claim 1, wherein the third photodiode is in one of two rows that are between the row of the first photodiode and the row of the second photodiode.

3. The image sensor of claim 1, wherein the row of the second photodiode is between the row of the third photodiode and a row of the fourth photodiode.

4. The image sensor of claim 3, wherein the second photodiode is in one of two rows that are between the row of the third photodiode and the row of the fourth photodiode.

5. The image sensor of claim 1, wherein the first column is immediately adjacent to the second column, and wherein the first, second, third, and fourth photodiodes are arranged such that there is exactly one row between the row of the first photodiode and the row of the third photodiode, the second photodiode is in a row immediately adjacent to the row of the third photodiode, and that there is exactly one row between the row of the fourth photodiode and the second photodiode.

6. The image sensor of claim 1, wherein each pixel unit includes no more than four photodiodes and has a height that spans six rows of the array and a width that spans two columns of the array.

7. The image sensor of claim 1, wherein each pixel unit further include a fifth, a sixth, a seventh, and an eighth photodiode, each coupled to the shared pixel unit circuitry, wherein the fifth and sixth photodiodes are in the first column and the seventh and eighth photodiodes are in the second column, and wherein each of the first, second, third, fourth, fifth, sixth, seventh, and eighth photodiodes are in a row different from one another.

8. The image sensor of claim 1, wherein each pixel unit further comprises a first shared floating diffusion region coupled to receive charge accumulated in the first and the second photodiodes, and a second shared floating diffusion region coupled to receive charge accumulated in the third and fourth photodiodes.

9. The image sensor of claim 8, wherein the shared pixel unit circuitry includes a shared reset transistor coupled to reset both the first and second shared floating diffusions.

10. The image sensor of claim 9, further comprising a plurality of the shared reset transistors, each corresponding to a respective pixel unit, and wherein the plurality of shared reset transistors are disposed along a single horizontal channel that is between two rows of photodiodes.

11. The image sensor of claim 8, wherein the single shared source follower transistor of the shared pixel unit circuitry of each one of the pixel units is coupled to read out an image signal from the first and second shared floating diffusions.

12. The image sensor of claim 11, wherein the shared pixel unit circuitry of each one of the pixel units is disposed along a horizontal channel that is between two rows of photodiodes.

13. The image sensor of claim 1, further comprising a plurality of column bit lines, each column bit line corresponding to a respective column of the array, wherein each pixel unit is coupled to no more than one column bit line.

14. The image sensor of claim 13, further comprising a column switching circuit coupled to selectively shift a pixel signal from one column bit line to another column bit line.

15. The image sensor of claim 14, wherein the column switching circuit further comprises:
 a plurality of switches coupled to the column bit lines, each switch configured to selectively connect one column bit line to an adjacent column bit line; and a logic circuit coupled to control the plurality of switches based on which row of the array is being read out.

16. A complementary metal oxide semiconductor (CMOS) image sensor,
comprising a plurality of photodiodes arranged into an array of rows and columns, wherein the plurality of photodiodes are grouped into pixel units including:
a first pixel unit of a first, a second, a third, and a fourth photodiode and a first shared pixel unit circuitry coupled to each of the first, second, third, and fourth photodiodes, wherein the first and second photodiodes are in a first column of the array and the third and fourth photodiodes are in a second column of the array; and
a second pixel unit adjacent to the first pixel unit, wherein the second pixel unit includes a fifth, a sixth, a seventh, and an eighth photodiode and second shared pixel unit circuitry coupled to each of the fifth, sixth, seventh, and eighth photodiodes, wherein the fifth and sixth photodiodes are in the second column of the array and the seventh and eighth photodiodes are in a third column of the array, and wherein the sixth photodiode is in a row that is interposed between a row of the third photodiode and a row of the fourth photodiode.

17. The image sensor of claim 16, wherein the fifth, sixth, seventh, and eighth photodiodes are in the same rows as the first, second, third, and fourth photodiodes, respectively.

18. The image sensor of claim 16, further comprising:
a first and a second shared floating diffusion region included in the first pixel unit, coupled to receive charge accumulated in the first, second, third, and fourth photodiodes; and
a third and a fourth shared floating diffusion region included in the second pixel unit, coupled to receive charge accumulated in the fifth, sixth, seventh, and eighth photodiodes, wherein the first shared pixel unit circuitry includes a first shared reset transistor coupled to reset both the first and second shared floating diffusions, and wherein the second shared pixel unit circuitry includes a second shared reset transistor coupled to reset both the third and fourth shared floating diffusions.

19. The image sensor of claim 18, wherein the first and second shared reset transistors are disposed along a single horizontal channel that is between two rows of photodiodes.

20. The image sensor of claim 18, wherein the first shared pixel unit circuitry further includes a first shared source follower transistor for reading out an image signal from the first and second shared floating diffusions, and wherein the second shared pixel unit circuitry further includes a second shared source follower transistor for reading out an image signal from the third and fourth shared floating diffusions.

21. The image sensor of claim 20, wherein the first and second shared source follower transistors are disposed along a horizontal channel that is between two rows of photodiodes.

22. The image sensor of claim 18, further comprising:
a plurality of column bit lines, each column bit line corresponding to a respective column of the array, wherein each pixel unit is coupled to no more than one column bit line; and
a column switching circuit coupled to the column bit lines to selectively shift a pixel signal from one column bit line to another column bit line.

23. The image sensor of claim 22, wherein the column switching circuit further comprises:
a plurality of switches coupled to the column bit lines, each switch configured to selectively connect one column bit line to an adjacent column bit line; and
a logic circuit coupled to control the plurality of switches based on which row of the array is being read out.

* * * * *